United States Patent [19]

Wang et al.

[11] Patent Number: 5,574,306

[45] Date of Patent: Nov. 12, 1996

[54] LATERAL BIPOLAR TRANSISTOR AND FET

[75] Inventors: Ying-Tzung Wang; Sheng-Hsing Yang, both of Hsinchu, Taiwan

[73] Assignee: United Microelectronics Corporation, Hsin-Chu, Taiwan

[21] Appl. No.: 500,470

[22] Filed: Jul. 10, 1995

Related U.S. Application Data

[62] Division of Ser. No. 355,478, Dec. 14, 1994, Pat. No. 5,449,627.

[51] Int. Cl.[6] ............... H01L 29/00; H01L 27/082; H01L 27/102
[52] U.S. Cl. ............... 257/557; 257/571; 257/588
[58] Field of Search ................ 257/557, 558, 257/559, 513, 514, 515

[56] References Cited

U.S. PATENT DOCUMENTS

| | | | |
|---|---|---|---|
| 4,743,565 | 5/1988 | Goth et al. | 437/32 |
| 4,749,661 | 6/1988 | Bower | 257/559 |
| 5,049,964 | 9/1991 | Sakai et al. | 257/557 |
| 5,187,109 | 2/1993 | Cook et al. | 437/32 |

*Primary Examiner*—Wael M. Fahmy
*Attorney, Agent, or Firm*—William H. Wright

[57] ABSTRACT

A lateral bipolar transistor and method of making the transistor are disclosed. The device is made by etching a trench around a central region of a semiconductor body. An emitter is buried beneath the surface of this central area and contact to it is made via a self-alignment technique. The collector region of the transistor is contacted through the floor of the trench while the base region of the transistor is contacted in a region that surrounds the trench. The described method is compatible with the simultaneous manufacture of FET devices on the same chip.

16 Claims, 8 Drawing Sheets

LATERAL BIPOLAR TRANSISTOR AND FET

This is a divisional of application Ser. No. 08/355,478, filed Dec. 14, 1994, which issued as U.S. Pat. No. 5,449,627.

BACKGROUND OF THE INVENTION (1) Field of the Invention

The present invention relates to a bipolar lateral transistor and method of fabricating it, more particularly to a method that allows the simultaneous fabrication of FET (Field Effect Transistor) devices.

(2) Description of the Prior Art

Aside from improvements in material quality, improved performance of transistors, both bipolar and field effect, has been achieved by successful reduction of the dimensions of the various subregions that, together, constitute a transistor. Examples of parameters that need to be minimized in order to optimize device performance are emitter-base and collector-base capacitances. These parameters decrease as emitter and collector area, respectively, are reduced in size. Similarly, switching speed increases as the base width (emitter-to-collector distance) is decreased.

Reductions in the dimensions of the various subregions of transistor devices were effected by means of improved photoresist and associated techniques, such as, for example, etching methods. As the limits of what could be achieved by these techniques approached, other ways of bringing about these reductions had to be found.

One such approach to the problem of device size reduction has been the lateral transistor. In conventional, or planar, transistors incorporated as part of integrated circuits, the emitter dimensions (for example) are limited by what can be achieved by masking and etching a planar surface. Thus, if the emitter is to take the shape of a rectangle, its lesser dimension (or line width) is, for planar technology, limited by the state of the masking and etching art—presently about 0.5 microns.

The lateral transistor geometry derives from the fact that the thickness of a layer, be it a diffusion region or a deposited film, can be controlled to much tighter tolerances than can line width, as discussed above. Typically, layer thicknesses can be controlled to better than 0.01 microns. This fact is utilized in lateral transistor design by, in effect, making cross-sections of one or more layers and then using the resulting exposed regions to define the various subareas of the device.

In order to achieve this cross-sectioning effect, processes for making lateral transistors have centered around providing a pedestal, or mesa, that protrudes above the surrounding surface of the integrated circuit, the actual transistor being now in part constructed along the vertical edges of said pedestal. An example of the use of such a structure to create a lateral transistor can be seen in U.S. Pat. No. 4,743,565, May 10 1988, by G. R. Goth and S. D. Malaviya. A similar structure, also employing a mesa, has been described by Cook and Pelella in U.S. Pat. No. 5,187,109, February 1993.

A disadvantage of both these examples of lateral transistors is that a major portion of the device is higher than the plane of the surrounding integrated circuit. This makes it difficult to achieve full planarization of the total surface, leading in turn to difficulties in any subsequent alignment and registration steps that have yet to be performed to complete the manufacture of the integrated circuit, for example the provision of inter-device wiring.

SUMMARY OF THE INVENTION

It is an object of the present invention to provide an improved lateral transistor.

A further object of the invention is to provide a process for manufacturing a bipolar transistor which allows for the simultaneous manufacture of FET devices on the same chip.

It is yet a further object of the invention to provide a lateral transistor which simplifies, rather than complicates, subsequent planarization steps in the manufacturing process.

BRIEF DESCRIPTION OF THE DRAWINGS

FIGS. 1A through 7A show cross-sectional views of a semiconductor structure, illustrating the results of the various steps of a method of making a lateral bipolar transistor in accordance with the present invention, while FIGS. 1B through 7B illustrate the results of the same steps on the making of a field effect transistor.

The drawings are not to scale.

DESCRIPTION OF THE PREFERRED EMBODIMENTS

Figure 6A:
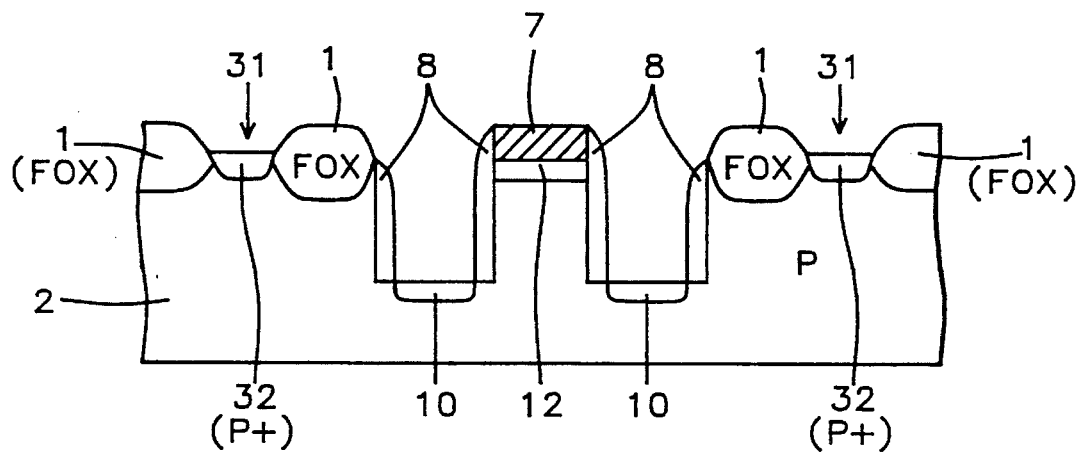
Figure 7A:
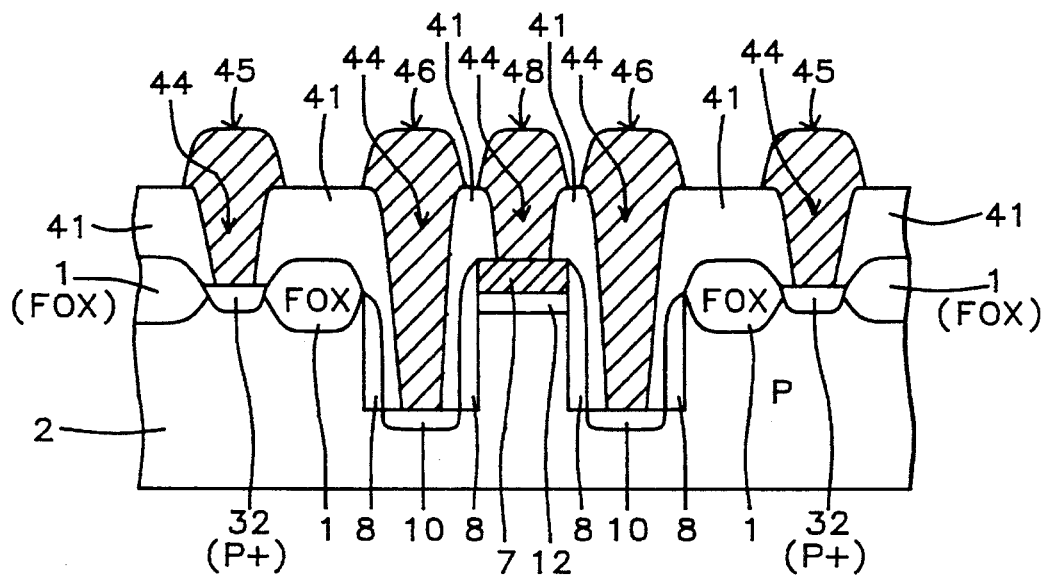

The structure of the bipolar lateral transistor that is the subject of this disclosure is fully illustrated in FIGS. 6A and 7A, but it will be more easily understood by a prior review of the process for its manufacture. In particular, since the technology of choice for most of today's integrated circuits is FET based, bipolar devices find their most widespread application as special purpose devices within integrated circuits that are built primarily from FET devices. Examples of such special purpose applications include current detectors and off-chip drivers.

Thus, when developing a process for the manufacture of a bipolar transistor, it is important that such a process be capable of producing FET devices at the same time as the bipolars with a minimum of process steps that contribute to the generation of only one of the two device types. Such a process has been developed and will now be described. Each of the process steps will be discussed with respect to both the bipolar device that constitutes the present invention and a portion of an FET circuit on an adjacent area in the same chip.

Figure 1A:
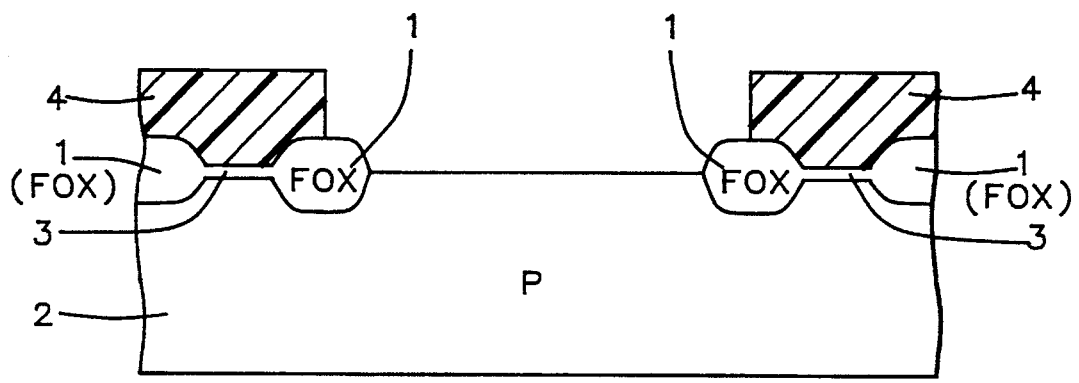
Figure 1B:
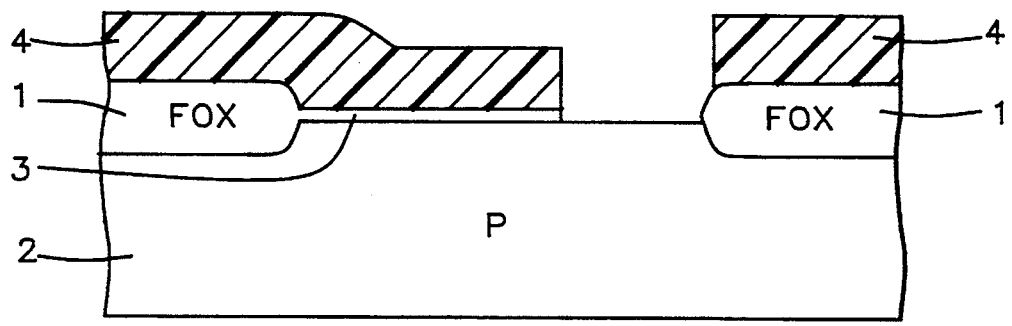

Referring now to FIGS. 1A and 1B, schematic cross-sections at the surface of a typical integrated circuit in its early stages are shown. In both cases the body of the semiconductor is of P type conductivity and is covered by a thin layer of gate oxide 3. FIG. 1A shows the starting point for the bipolar transistor region. It has been processed to the point of providing three regions, separated from one another by areas 1 of FOX (field oxide). The central area is left unprotected while the outlying regions, including part of the FOX 1 and gate oxide 3, are covered by a layer of photoresist 4 so that the exposed gate oxide is readily removed by etching, as shown.

Similarly, as illustrated in FIG. 1B, the surface has been coated with a first layer of photoresist 4 so that a portion of gate oxide 3 could be etched away. In this (the FET) case, however, gate oxide continues to cover about two thirds of the area between the two regions of FOX 1, the cleared area being asymmetrically located to one side. Prior to stripping away photoresist layer 4, etching is allowed to proceed for longer than would be necessary to only just remove the layer of gate oxide 3 (overetching).

Figure 2A:
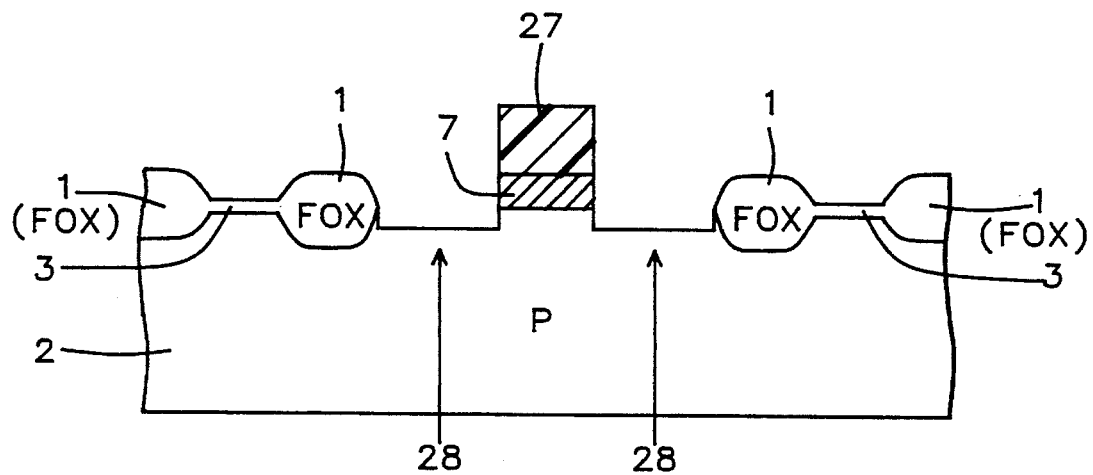
Figure 2B:
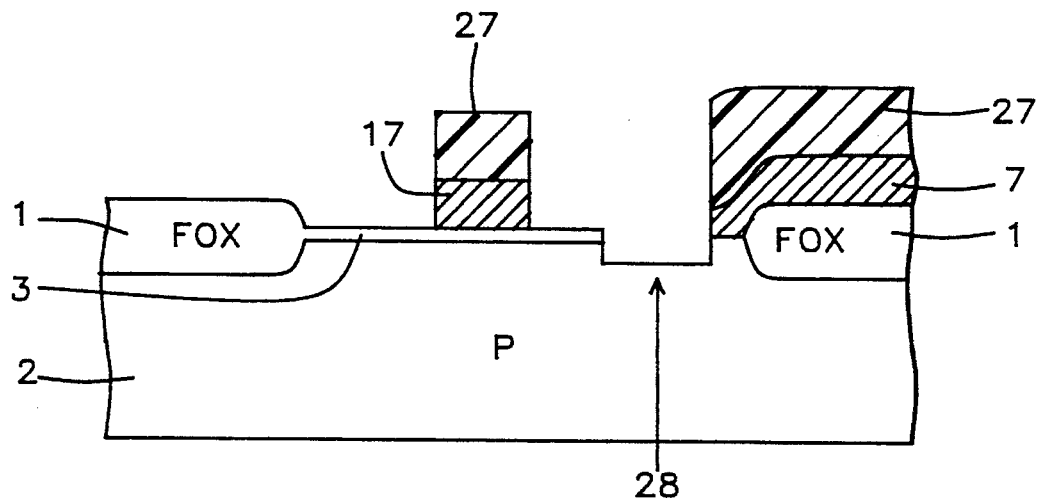

Central area 2 (in FIG. 1A) is now covered with a first layer of polycrystalline silicon deposited by means of chemical vapor deposition (CVD) to a thickness between 0.2 and 0.4 microns. This is followed by an ion implantation step such that said polycrystalline silicon (designated 7 in FIG. 2A and and 17 in FIG. 2B) is now doped so as to be N+ (strongly N type). A second photoresist mask 27 is now applied and layer 7 is etched away everywhere except where protected by 27. The appearance of the bipolar and FET areas is now as shown in FIGS. 2A and 2B respectively. Note that shallow trenches 28 have been created as a result of the aforementioned overetching.

Figure 3A:
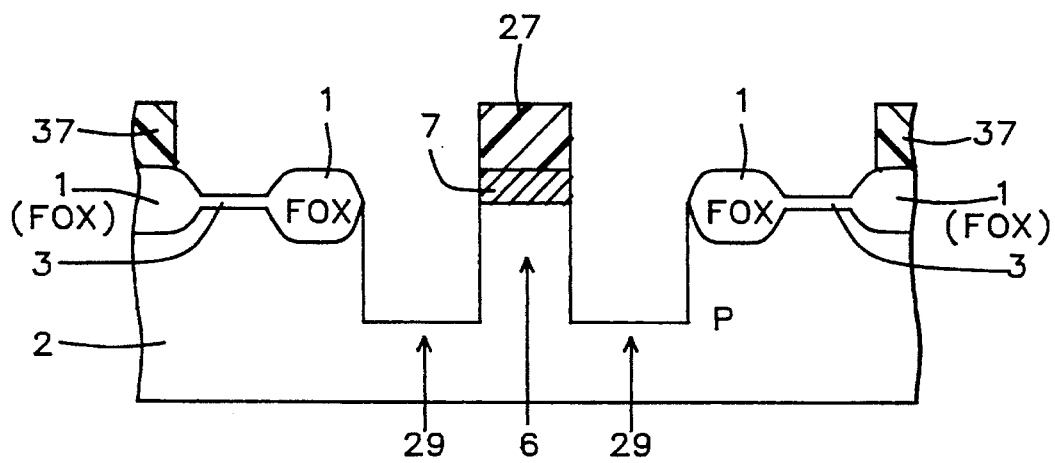
Figure 3B:
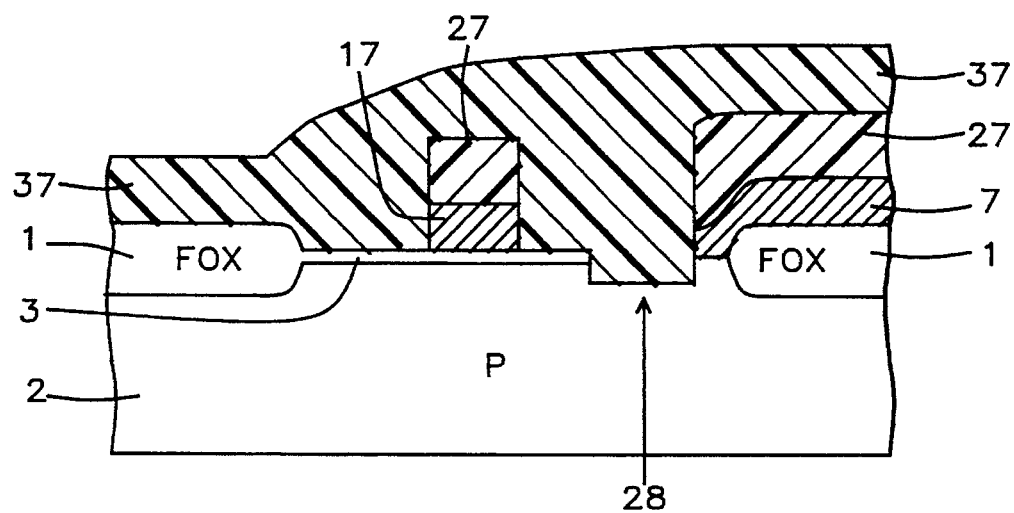

Referring now to FIG. 3B, a third layer of photoresist 37 is now applied and processed so as to cover only the FET region. The entire structure is now subjected to a silicon anisotropic etch, typically reactive ion etching (RIE) in chlorine gas, thereby creating deep trench 29 in the bipolar region only, as shown in FIG. 3A. Creation of trench 29 results in the emergence of pedestal 6. Note that overetching is also necessary at this stage so as to ensure that all side walls are completely free of any residual material.

Figure 4A:
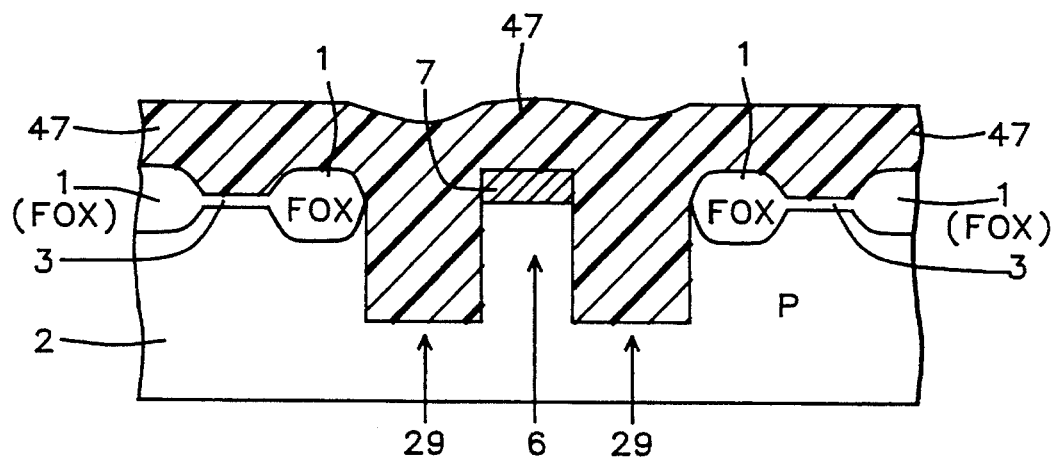
Figure 4B:
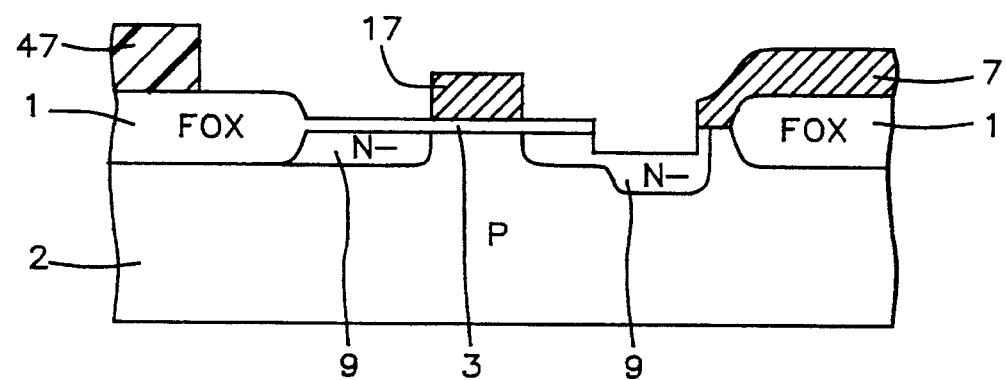

Photoresist layers 27 and 37 are now stripped away and a fourth layer of photoresist 47 is applied to the bipolar regions only, as illustrated in FIG. 4A. The entire structure is now subjected to a low dosage ion implant of N type dopant, such as phosphorus. This does not affect the bipolar side (since it is protected by photoresist layer 47) but, on the FET side, areas of N– type silicon 9 are created.

Figure 5A:
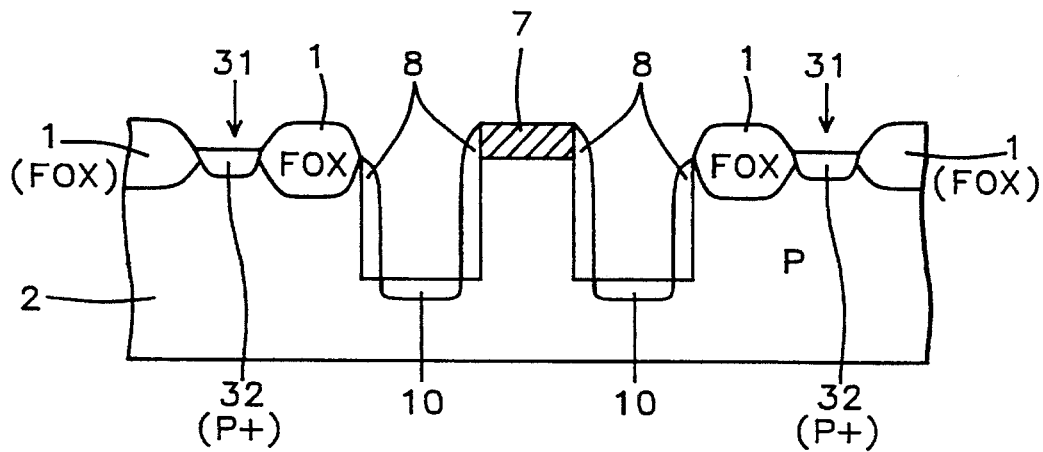
Figure 5B:
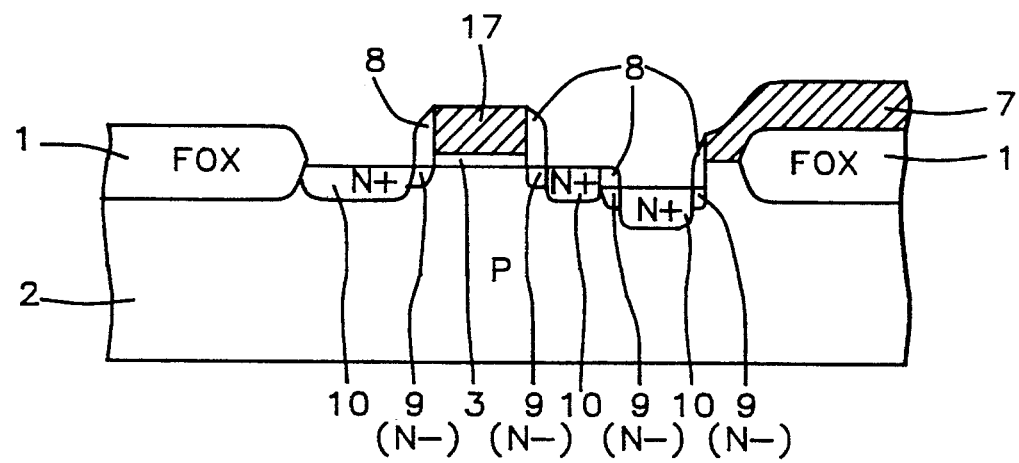

CVD $SiO_2$ is now deposited over the entire structure to a thickness of between 0.2 and 0.4 microns. The structure is then subjected to an anisotropic etch such that the deposited oxide is removed from the bottom of the trench but not from the sidewalls, including the sidewalls of the pedestal 6. This oxide, left on the sidewalls, serves as spacers 8 (see FIGS. 5A and 5B) to prevent the sidewall surfaces from becoming N+ doped during the next step wherein suitable masking and ion implantation techniques are used to create N+ regions 10 as shown in FIGS. 5A and 5B. Note that the original N– regions 9 are still present in FIG. 5B but have been largely incorporated into regions 10 by virtue of the additional N type dopant that they received.

Following the N+ implantation, fresh photoresist masks are applied to protect the entire structure except in the regions designated as 31 in FIG. 5A. The layer of gate oxide there is etched away and the structure is subjected to high dosage implantation of boron ions, thus creating the P+ regions marked as 32 in FIG. 5A.

Figure 6B:
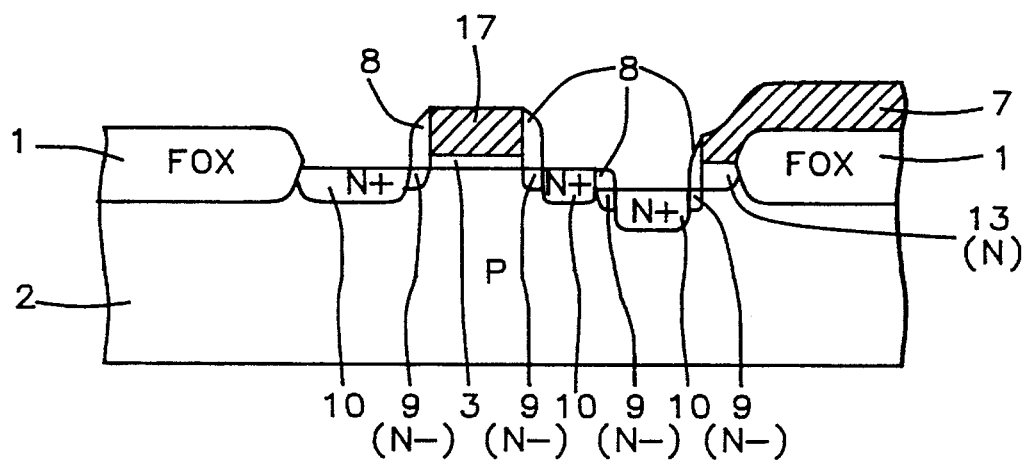

The entire structure is now subjected to a thermal drive-in treatment for 20 to 40 minutes at approximately 900° C. This serves to drive N type dopant atoms from the heavily N doped polycrystalline silicon regions 7 in FIGS. 6A and 6B into the single crystalline P type body, thereby creating a buried emitter 12 in FIG. 6A and a buried region 13 (in FIG. 6B) that could be used as a connector between, for example, the bipolar and the FET regions.

Figure 7B:
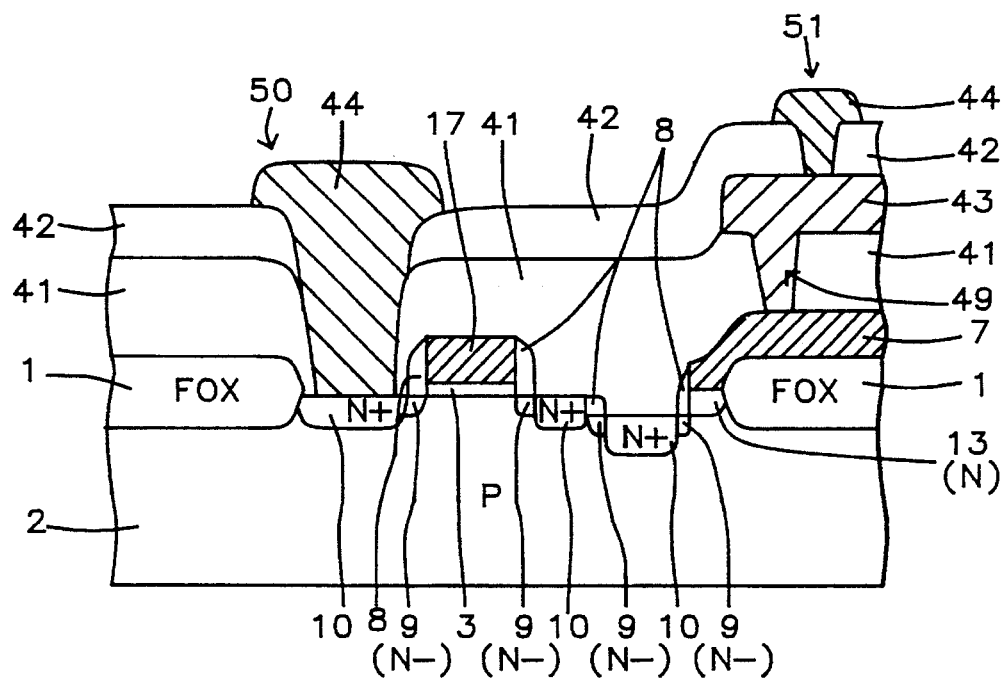

Finally, a passivation layer of insulation 41 is deposited over the entire structure, as illustrated in FIGS. 7A and 7B. On the FET side only, via holes such as 49 in FIG. 7B are etched so as to allow contact with first polycrystalline layer 7 by a second polycrystalline layer 43. Additional insulation 42 is then deposited to protect layer 43. Layer 42 is not explicitly shown in FIG. 7A, being indistinguishable from layer 41. Via holes are now etched in the insulation and metallic layer 44 is deposited so as to make contact with the various regions that are made accessible as a result of creating said via holes.

Figure 8:
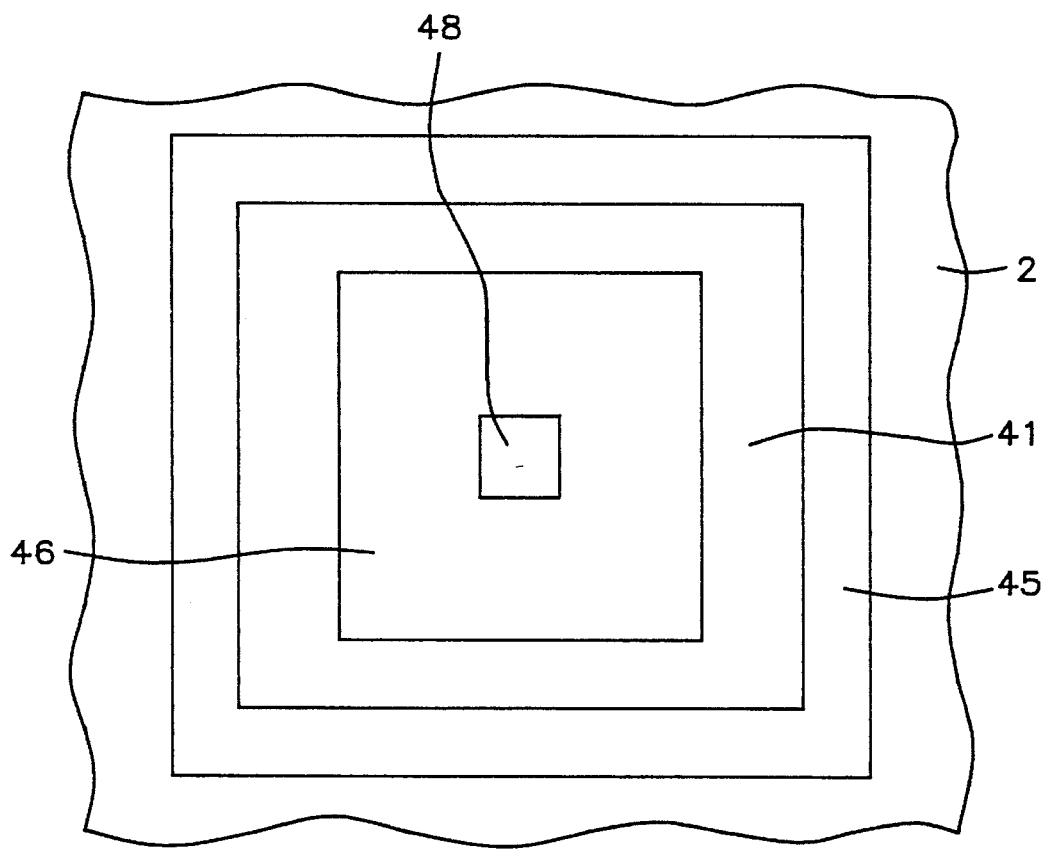
FIG. 8 is a plan view of the structure whose cross-sectional view is shown in FIG. 7A.

On the bipolar side (FIG. 7A) the base contact of the lateral transistor that is the subject of this disclosure has been tagged as 45, the collector as 46, and the emitter contact as 48. A plan view of the lateral transistor is presented in FIG. 8. On the FET side (FIG. 7B) the processing has led to the creation of an FET whose source contact has been tagged as 50 while the drain contact is tagged as 51. Note that contact to the gate 17 is not made through a via hole. Instead, the polycrystalline silicon layer from which 17 was formed is shaped so as to extend in a direction perpendicular to the plane of FIG. 7B, thereby serving as a buried connector.

While the invention has been particularly shown and described with reference to the preferred embodiments thereof, it will be understood by those skilled in the art that various changes in form and details may be made without departing from the spirit and scope of the invention.

What is claimed is:

1. A lateral bipolar NPN transistor structure comprising:
   a body of P type semiconductor material, said body having an upper surface;
   a trench downwardly extending from said upper surface of said body, said trench having a floor displaced away from said upper surface of said body;
   a pedestal of P type semiconductor material integral with said P type body, surrounded by said trench and extending upwardly above said floor of said trench so that an upper surface of said pedestal is coplanar with said upper surface of said body;
   a layer of heavily doped N type semiconductor material in intimate contact with said upper surface of said pedestal;
   a first region of heavily doped N type semiconductor material located immediately below said upper surface of said pedestal;
   a second region of heavily doped N type semiconductor material located immediately below said floor of said trench; and
   a region of heavily doped P type semiconductor material located immediately below said upper surface of said body and positioned so as to surround said trench.

2. The structure described in claim 1 wherein said trench is filled with insulating material.

3. The structure described in claim 2 wherein said body of semiconductor material is silicon.

4. The structure described in claim 3 wherein said insulating material is silicon oxide.

5. The structure described in claim 3 wherein said layer of heavily doped N type semiconductor material is polycrystalline silicon.

6. The structure described in claim 1 wherein said first and second regions of heavily doped N type semiconductor material form emitter and collector regions, respectively, and said region of heavily doped P type semiconductor material forms a contact to a base region.

7. The structure described in claim 1 further comprising:
   a layer of insulation above said body;
   via holes etched in said layer of insulation so as to allow contact to said first and second regions of heavily doped N type semiconductor material as well as to said region of heavily doped P type semiconductor material; and
   a layer of conductive material on said layer of insulation etched into a pattern such that separate electrical contact can be made to each of said first and second regions of heavily doped N type semiconductor material as well as to said region of heavily doped P type semiconductor material.

8. A lateral NPN transistor structure comprising:

a body of P type semiconductor material, said body having an upper surface;

a trench extending downward from said upper surface of said body, said trench having a floor displaced away from said upper surface of said body;

a pedestal formed integral with said body, surrounded by said trench and extending above said floor of said trench so that an upper surface of said pedestal is coplanar with said upper surface of said body;

a first region of heavily doped N type semiconductor material extending laterally across and immediately below said upper surface of said pedestal;

a second region of heavily doped N type semiconductor material located immediately below said floor of said trench; and a region of heavily doped P type semiconductor material forming a contact to a base region of said lateral NPN transistor, said base region including a P type portion of said pedestal located immediately below said first region of heavily doped N type semiconductor material, said region of heavily doped P type semiconductor material positioned outside of a boundary of said trench so that a conduction path from said region of heavily doped P type semiconductor material to said P type portion of said pedestal passes under said trench.

9. A lateral bipolar transistor comprising:

a body of crystalline silicon, said body having an upper surface;

a trench downwardly extending from said upper surface of said body, said trench having a floor displaced away from said upper surface of said body;

a pedestal formed integral with said body, surrounded by said trench and extending above said floor of said trench so that an upper surface of said pedestal is coplanar with said upper surface of said body;

a first layer of heavily doped semiconductor material of a first conductivity type extending laterally immediately below said upper surface of said pedestal, said first layer forming one of an emitter and collector region of said lateral bipolar transistor, at least a portion of said pedestal other than said first layer doped to a second conductivity type and forming a pedestal base region of said lateral bipolar transistor;

a second layer of heavily doped semiconductor material of said first conductivity type located immediately below said floor of said trench, said second layer forming one of an emitter and collector region of said lateral bipolar transistor; and a base contact region of heavily doped semiconductor material of said second conductivity type electrically connected to said pedestal base region of said lateral bipolar transistor.

10. The lateral bipolar transistor of claim 9 wherein said base contact region is positioned outside of a boundary of said trench so that a conduction path from said base contact region to said pedestal base region passes under said trench.

11. The lateral bipolar transistor of claim 9 wherein said first layer extends across and covers said pedestal.

12. The lateral bipolar transistor of claim 9 wherein said pedestal consists of said first layer and said pedestal base region.

13. The lateral bipolar transistor of claim 9 further comprising a layer of heavily doped polysilicon covering said upper surface of said pedestal.

14. The lateral bipolar transistor of claim 9 further comprising a layer of polysilicon heavily doped to said first conductivity type.

15. The lateral bipolar transistor of claim 9 wherein said first conductivity type is N type.

16. The lateral bipolar transistor of claim 9 wherein said second layer surrounds said pedestal.

* * * * *